(12) United States Patent
Choi

(10) Patent No.: US 12,335,645 B2
(45) Date of Patent: Jun. 17, 2025

(54) IMAGE SENSOR INCLUDING POWER MANAGEMENT UNIT FOR NOISE REDUCTION USING CHOPPING OPERATION AND OPERATION METHOD THEREOF

(71) Applicant: Samsung Electronics Co., Ltd., Suwon-si (KR)

(72) Inventor: Yongsuk Choi, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 92 days.

(21) Appl. No.: 18/298,033

(22) Filed: Apr. 10, 2023

(65) Prior Publication Data

US 2024/0080583 A1    Mar. 7, 2024

(30) Foreign Application Priority Data

Sep. 7, 2022    (KR) ................. 10-2022-0113742

(51) Int. Cl.
   *H04N 25/70*    (2023.01)
   *H04N 25/709*   (2023.01)
   *H04N 25/76*    (2023.01)
   *H10F 39/00*    (2025.01)

(52) U.S. Cl.
   CPC ....... *H04N 25/709* (2023.01); *H04N 25/7795* (2023.01); *H10F 39/802* (2025.01); *H10F 39/8037* (2025.01)

(58) Field of Classification Search
   CPC .............. H04N 25/709; H04N 25/7795; H01L 27/14603; H01L 27/14609; H01L 27/14612
   See application file for complete search history.

(56) References Cited

U.S. PATENT DOCUMENTS

| | | | |
|---|---|---|---|
| 7,336,123 B2 | 2/2008 | Yoshida et al. | |
| 7,795,960 B2 | 9/2010 | Lyden et al. | |
| 8,604,762 B2 | 12/2013 | Bakkaloglu et al. | |
| 10,268,226 B1 | 4/2019 | Wang et al. | |
| 2010/0079649 A1 | 4/2010 | Ayraud | |
| 2015/0163435 A1* | 6/2015 | Ota ..................... | H04N 25/745 348/335 |
| 2021/0013803 A1 | 1/2021 | Tanaka et al. | |

FOREIGN PATENT DOCUMENTS

JP    H06014251 A    1/1994

* cited by examiner

*Primary Examiner* — Kevin K Pyo
(74) *Attorney, Agent, or Firm* — Harness, Dickey & Pierce, P.L.C.

(57) ABSTRACT

An image sensor includes a pixel array including a plurality of pixel groups arranged in a plurality of rows and columns, the plurality of pixel groups configured to convert a light into electrical signals and to generate pixel signals, a row driver configured to generate a plurality of control signals for controlling the rows of the pixel array, and one or more power management devices configured to generate a power supply voltage for generating the plurality of control signals based on an input signal, and supply the power supply voltage to the row driver. Each of the one or more power management devices includes a first chopping circuit configured to modulate the input signal, an amplifier configured to generate an output signal based on the modulated input signal, and a second chopping circuit configured to demodulate the output signal and to modulate a noise caused by the amplifier.

13 Claims, 13 Drawing Sheets

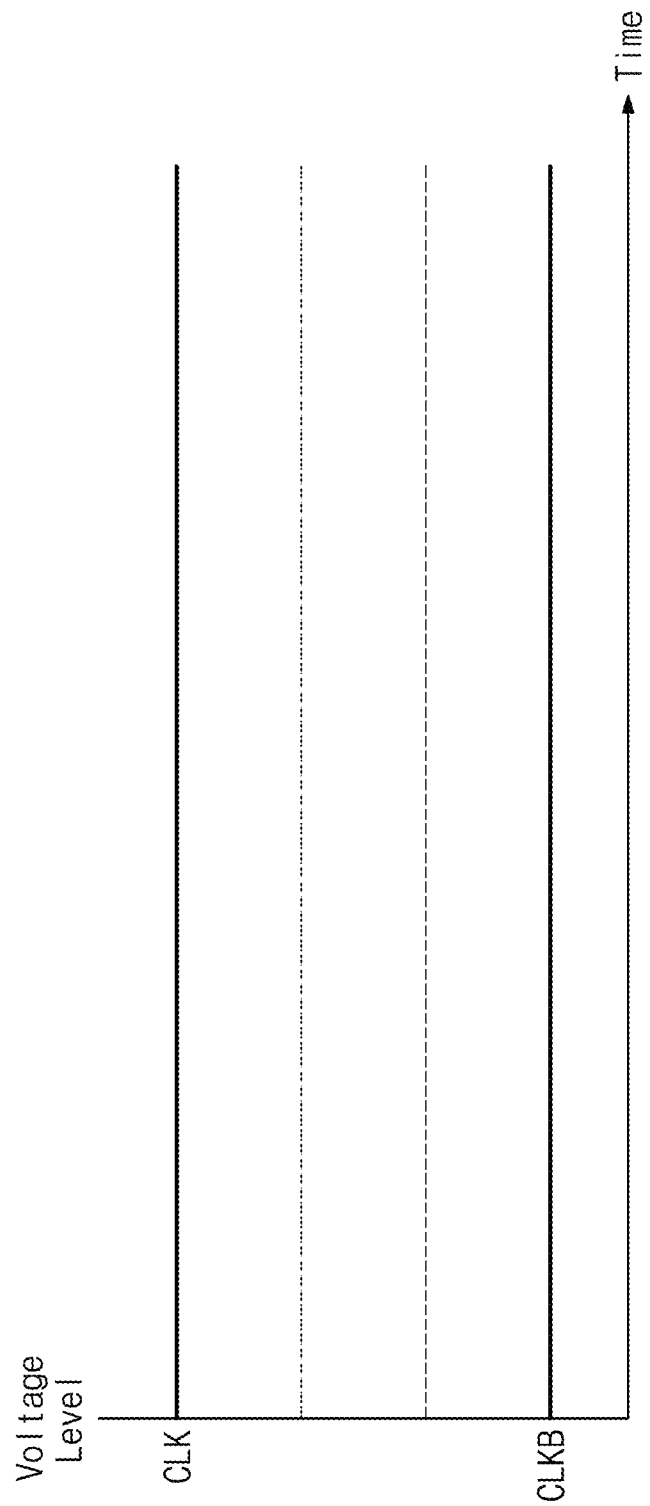

IMAGE SENSOR INCLUDING POWER MANAGEMENT UNIT FOR NOISE REDUCTION USING CHOPPING OPERATION AND OPERATION METHOD THEREOF

CROSS-REFERENCE TO RELATED APPLICATION

This application claims priority under 35 U.S.C. § 119 to Korean Patent Application No. 10-2022-0113742 filed on Sep. 7, 2022, in the Korean Intellectual Property Office, the disclosure of which is incorporated by reference herein in its entirety.

BACKGROUND

Some example embodiments of the inventive concepts relate to an electronic device, including an image sensor including a power management module for noise reduction using a chopping operation and/or an operation method thereof.

An image sensor includes a charge coupled device (CCD) image sensor, a complementary metal-oxide semiconductor (CMOS) image sensor (CIS), etc. The CMOS image sensor includes pixels composed of CMOS transistors and converts light energy into an electrical signal by using a photoelectric conversion element (or device) included in each pixel. The CMOS image sensor obtains information about a captured/photographed image by using the electrical signal generated by each pixel.

Because a noise included in a power supply voltage supplied to a row decoder of the image sensor is able to appear as a horizontal noise in a pixel array, it is important to reduce the noise included in the power supply voltage. When a capacitor is connected with an output terminal of a power management module, a noise of a high-frequency band included in the power supply voltage may be reduced. However, it is also desired or needed to reduce a noise of a low-frequency band, which is caused within an amplifier of the power management module.

SUMMARY

Some example embodiments of the inventive concepts provide an image sensor including a power management module for noise reduction using a chopping operation and/or an operation method thereof.

According to an example embodiment, an image sensor includes a pixel array including a plurality of pixel groups arranged in a plurality of rows and a plurality of columns, the plurality of pixel groups configured to convert a light into electrical signals and to generate pixel signals, a row driver configured to generate a plurality of control signals for controlling the rows of the pixel array, and supply the plurality of control signals to the plurality of pixel groups, and one or more power management devices configured to generate a power supply voltage for generating the plurality of control signals based on an input signal, and supply the power supply voltage to the row driver. Each of the one or more power management devices includes a first chopping circuit configured to modulate the input signal, an amplifier configured to generate an output signal based on the modulated input signal, and a second chopping circuit configured to demodulate the output signal and to modulate a noise caused by the amplifier. The image sensor includes a timing controller configured to generate a signal for controlling the row driver and the one or more power management devices, the timing controller configured to generate a clock signal and an inverse clock signal for controlling the first chopping circuit and the second chopping circuit.

According to an example embodiment, a circuit includes a first chopping circuit configured to receive a first input signal and a second input signal, a first transistor connected with the first chopping circuit, the first transistor configured to receive the first input signal passing through the first chopping circuit, a second transistor connected with the first chopping circuit, the second transistor configured to receive the second input signal passing through the first chopping circuit, and a third transistor connected with a source terminal of the first transistor and a source terminal of the second transistor, the third transistor configured to generate a power source current based on a first bias signal. The circuit includes a fourth transistor connected with a drain terminal of the first transistor and a first node, the fourth transistor configured to adjust a first voltage level of the first node based on a power supply voltage and a second bias signal, a fifth transistor connected with a drain terminal of the second transistor and a second node, the fifth transistor configured to adjust a second voltage level of the second node based on the power supply voltage and the second bias signal, a second chopping circuit connected with a drain terminal of the fourth transistor and a drain terminal of the fifth transistor, the second chopping circuit configured to receive the first voltage level and the second voltage level, and a sixth transistor configured to generate an output signal based on a third bias signal and the first and second voltage levels passing through the second chopping circuit.

According to an example embodiment, an operation method of an image sensor which includes a power management device including an amplifier, a first chopping circuit, and a second chopping circuit, includes modulating, at the first chopping circuit, an input signal, generating, at the amplifier, an output signal based on the modulated input signal, and demodulating, at the second chopping circuit, the output signal. The method includes generating, at the power management device, a power supply voltage based on the demodulated output signal, and providing the power supply voltage to a row driver configured to generate a plurality of control signals for controlling rows of a pixel array.

BRIEF DESCRIPTION OF THE DRAWINGS

The above and other objects and features of the inventive concepts will become apparent by describing in detail example embodiments thereof with reference to the accompanying drawings.

FIG. 7B is a timing diagram of a clock signal and an inverse clock signal when a chopping operation of a chopping circuit of FIG. 6 is disabled.

DETAILED DESCRIPTION

Below, some example embodiments of the inventive concepts will be described in detail and clearly to such an extent that one skilled in the art easily carries out the inventive concepts.

In the detailed description, components described with reference to the terms "unit", "module", "block", "—Per or —or", etc. and function blocks illustrated in drawings will be implemented as software, hardware, or a combination thereof. For example, the software may be a machine code, firmware, an embedded code, and application software. For example, the hardware may include an electrical circuit, an electronic circuit, a processor, a computer, an integrated circuit, integrated circuit cores, a pressure sensor, an inertial sensor, a microelectromechanical system (MEMS), a passive element, or a combination thereof.

Figure 1:
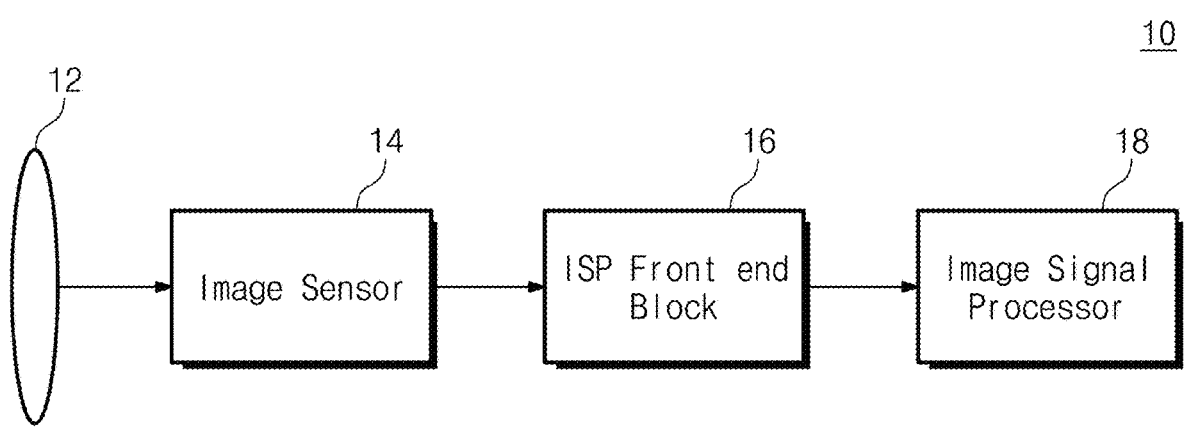
FIG. 1 is a diagram illustrating an example of a configuration of an image processing system according to an example embodiment of the inventive concepts.

FIG. 1 illustrates an example of a configuration of an image processing system 10 according to an example embodiment of the present disclosure. The image processing system 10 may be implemented as a part of various electronic devices such as a smartphone, a digital camera, a laptop computer, and a desktop computer. The image processing system 10 may include a lens 12, an image sensor 14, an image signal processor (ISP) front end block 16, and an image signal processor 18.

A light may be reflected by an object, a scenery, etc. targeted for photographing, and the lens 12 may receive the reflected light. The image sensor 14 may generate an electrical signal based on the light received through the lens 12. For example, the image sensor 14 may be implemented as a complementary metal-oxide semiconductor (CMOS) image sensor or the like. For example, the image sensor 14 may be a multi-pixel image sensor having a dual pixel structure or a tetracell structure.

The image sensor 14 may include a pixel array. Pixels of the pixel array may convert a light into electrical signals to generate pixel values. In addition, the image sensor 14 may include an analog-to-digital converting (ADC) circuit for performing correlated double sampling (CDS) on the pixel values. A configuration of the image sensor 14 will be described in detail with reference to FIG. 2.

The ISP front end block 16 may perform pre-processing on an electrical signal output from the image sensor 14 so as to be appropriate for processing of the image signal processor 18.

The image signal processor 18 may generate image data associated with the photographed object and scenery by appropriately processing the electrical signal processed by the ISP front end block 16. The image signal processor 18 may perform various processing operations such as color correction, auto white balance, gamma correction, color saturation correction, formatting, bad pixel correction, and hue correction.

One lens 12 and one image sensor 14 are illustrated in FIG. 1. However, in another example embodiment, the image processing system 10 may include a plurality of lenses, a plurality of image sensors, and a plurality of ISP front end blocks. In some example embodiments, the plurality of lenses may have different fields of view. Also, the plurality of image sensors may have different functions, different performances, and/or different characteristics, and may respectively include pixel arrays of different configurations.

Figure 2:
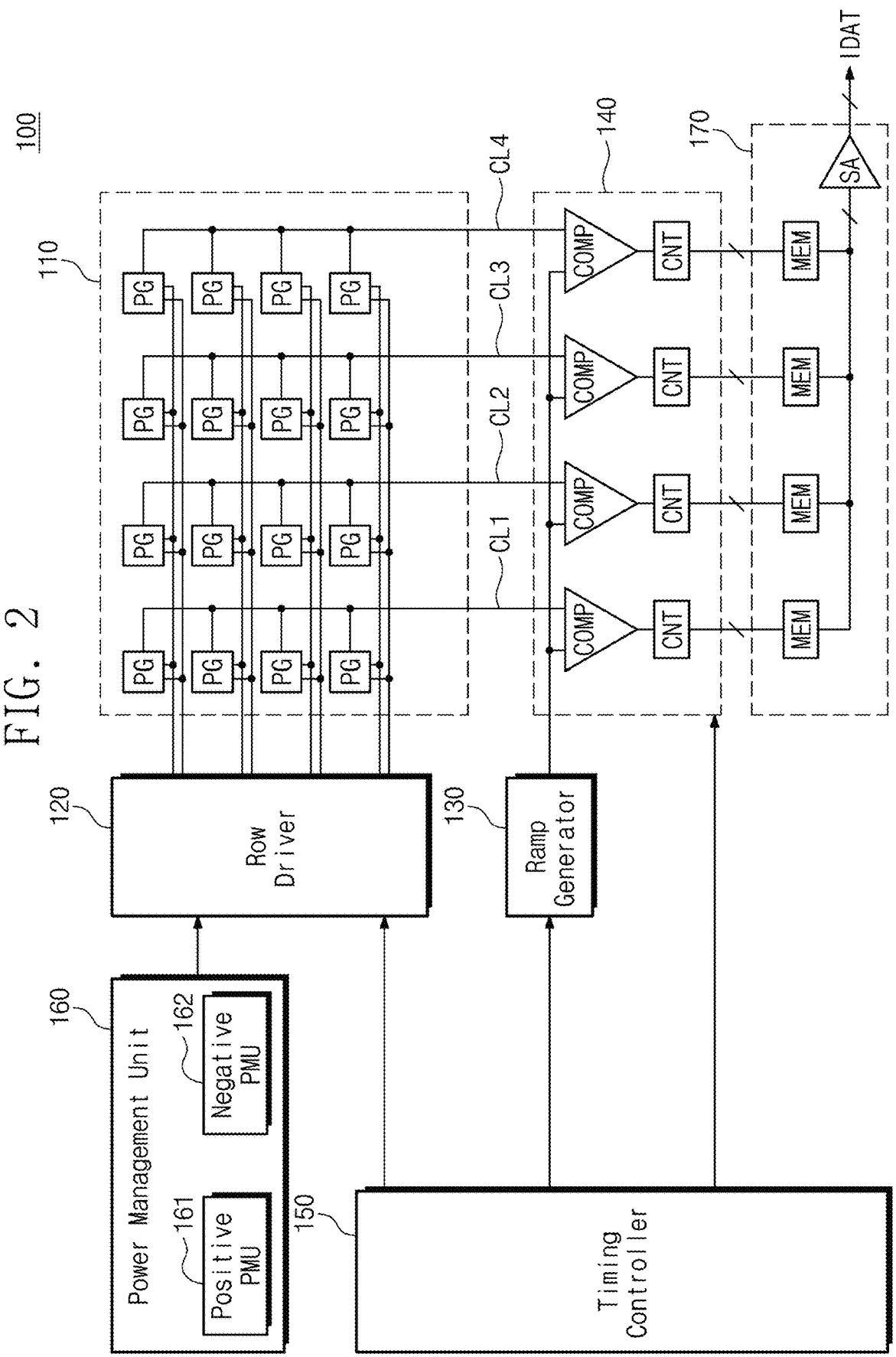
FIG. 2 illustrates an example of a configuration of an image sensor of FIG. 1.

FIG. 2 illustrates an example of a configuration of the image sensor 14 of FIG. 1. An image sensor 100 may include a pixel array 110, a row driver 120, a ramp signal generator 130, an ADC circuit 140, a timing controller 150, a power management module (PMU) 160, and a buffer 170.

The pixel array 110 may include a plurality of pixels arranged in the form of a matrix, that is, arranged along rows and columns Each of the plurality of pixels may include a photoelectric conversion element (or device). For example, the photoelectric conversion element may include a photo diode, a photo transistor, a photo gate, a pinned photo diode, or the like.

The pixel array 110 may include a plurality of pixel groups PG. Each pixel group PG may include two or more pixels, that is, a plurality of pixels. A plurality of pixels constituting a pixel group PG may share one floating diffusion region or a plurality of floating diffusion regions. An example in which the pixel array 110 includes the pixel groups PG arranged in the form of a matrix with four rows and four columns (e.g., includes 4×4 pixel groups PG) is illustrated in FIG. 2. However, example embodiments are not limited thereto.

The pixel group PG may include pixels of the same or substantially the same color. For example, the pixel group PG may include a red pixel to convert a light of a red spectrum into an electrical signal, a green pixel to convert a light of a green spectrum into an electrical signal, or a blue pixel to convert a light of a blue spectrum into an electrical signal. For example, the pixels constituting the pixel array 110 may be arranged in the form of a tetra-Bayer pattern.

The pixels of the pixel array 110 may output pixel signals through column lines CL1, CL2, CL3 and CL4, depending on the intensity or the amount of light received from the outside. For example, the pixel signal may be an analog signal corresponding to the intensity or the amount of light received from the outside. The pixel signals may pass through voltage buffers (e.g., source followers) and may then be provided to the ADC circuit 140 through the column lines CL1 to CL4.

The row driver 120 may select and drive a row of the pixel array 110. The row driver 120 may decode an address and/or a control signal generated by the timing controller 150 and may generate control signals for selecting and driving a row of the pixel array 110. For example, the control signals may include a signal for selecting a pixel, a signal for resetting a floating diffusion region, a signal for transferring charges to a floating diffusion region, and the like.

In particular, the row driver 120 may be supplied with a power supply voltage necessary to generate the control signals from the power management module 160. For example, the row driver 120 may include a level shifter for adjusting a voltage level of a signal generated by the timing controller 150 and a buffer for generating signals to be provided to the pixel array 110 based on a voltage supplied from the power management module 160.

The ramp signal generator 130 may generate a ramp signal under control of the timing controller 150. For example, the ramp signal generator 130 may operate in response to a control signal such as a ramp enable signal. When the ramp enable signal is activated, the ramp signal generator 130 may generate the ramp signal depending on preset values (e.g., a start level, an end level, and a slope). In other words, the ramp signal may refer to a signal that increases or decreases along a preset slope during a specific time. The image signal may be provided to the ADC circuit 140.

The ADC circuit 140 may receive pixel signals from the plurality of pixels of the pixel array 110 through the column lines CL1 to CL4 and may receive the ramp signal from the ramp signal generator 130. The ADC circuit 140 may operate based on a correlated double sampling (CDS) technique for obtaining a reset signal and an image signal from the received pixel signal and extracting a difference between the reset signal and the image signal as an effective signal component. The ADC circuit 140 may include a plurality of comparators COMP and a plurality of counters CNT.

In detail, each of the comparators COMP may compare the reset signal of the pixel signal and the ramp signal RAMP, may compare the image signal of the pixel signal and the ramp signal RAMP, and may perform correlated double sampling (CDS) on comparison results. Each of the counters CNT may count pulses of the signal experiencing the correlated double sampling and may output a counting result as a digital signal. An example in which the ADC circuit 140 includes four comparators COMP and four counters CNT is illustrated in FIG. 2, but example embodiments are not limited thereto.

The timing controller 150 may generate a control signal and/or a clock for controlling an operation and/or a timing of each of the row driver 120, the ramp signal generator 130, and the ADC circuit 140, and the power management module 160.

The power management module 160 may generate a power supply voltage necessary for the operation of the row driver 120 and may provide the power supply voltage to the row driver 120. In detail, the power management module 160 may include a positive PMU 161 that generates a power supply voltage associated with a signal having a high level from among a signal VSEL (e.g., refer to FIG. 3) for selecting a pixel, a signal VRST (e.g., refer to FIG. 3) for resetting the floating diffusion region, and a signal VT (e.g., refer to FIG. 3) for transferring charges to the floating diffusion region and a negative PMU 162 that generates a power supply voltage associated with a signal having a low level from among the signal VT for transferring charges to the floating diffusion region.

In particular, the power management module 160 according to an example embodiment of the inventive concepts may reduce the noise of the power supply voltage that is supplied to the row driver 120, by using a chopping operation. The power management module 160 may include chopping circuits for performing the chopping operation. For example, the chopping circuits may be connected with an amplifier included in the power management module 160. The chopping circuits may operate based on the clock provided from the timing controller 150.

The buffer 170 may include memories MEM and a sense amplifier SA. The memories MEM may store digital signals output from the corresponding counters CNT of the ADC circuit 140. The sense amplifiers SA may sense and amplify the digital signals stored in the memories MEM. The sense amplifier SA may output the amplified digital signals as image data IDAT, and the image data IDAT may be provided to the ISP front end block 16 of FIG. 1.

Figure 3:
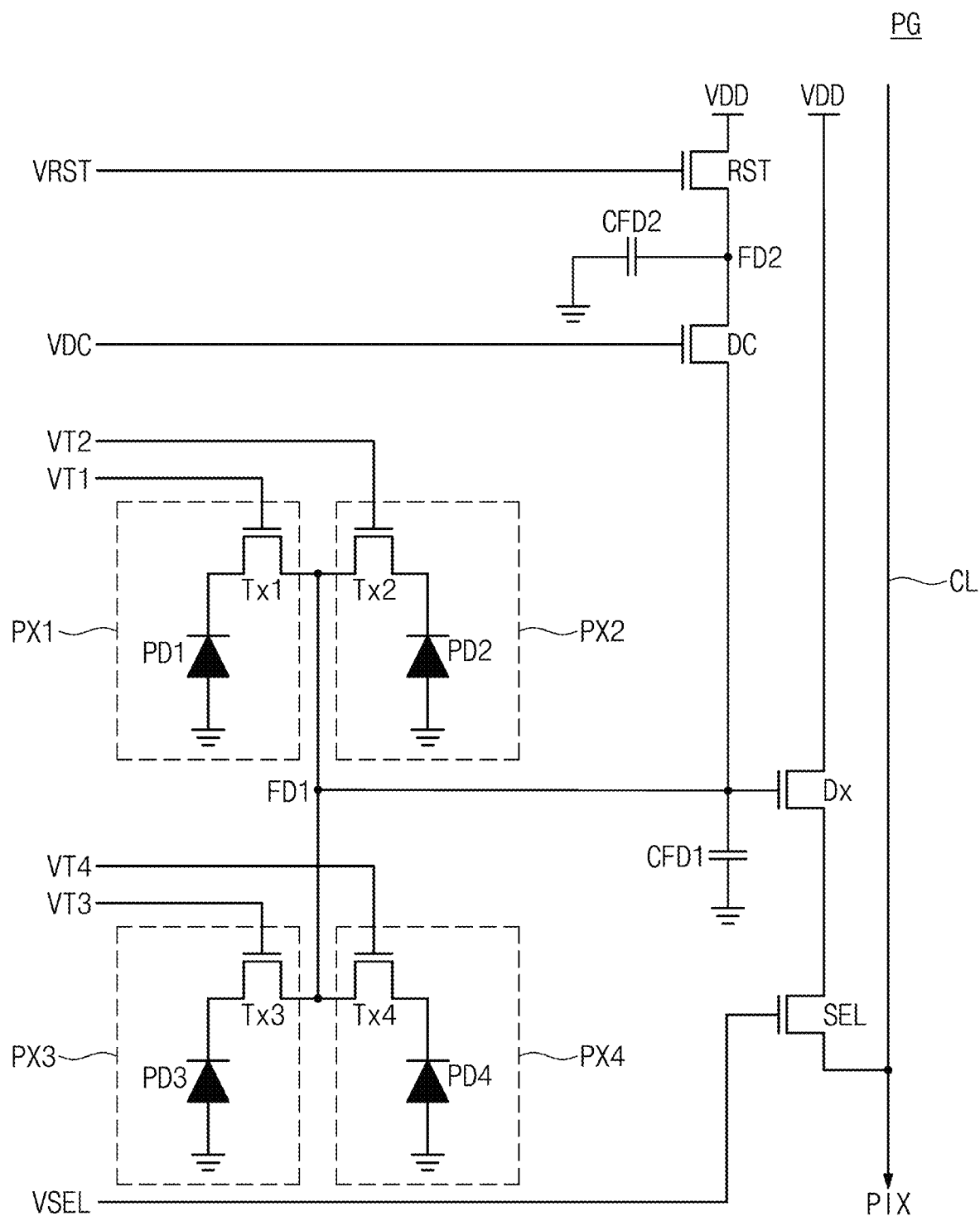
FIG. 3 is a circuit diagram illustrating an example embodiment of one pixel group among multiple pixel groups of a pixel array of FIG. 2.

FIG. 3 is a circuit diagram illustrating an example of one of the pixel groups PG of the pixel array 110 of FIG. 2. For example, the pixel group PG may include pixels PX1 to PX4, photoelectric conversion elements PD1, PD2, PD3 and PD4, transfer transistors Tx1, Tx2, Tx3 and Tx4, a reset transistor RST, a dual conversion transistor DC, a drive transistor Dx, and a select transistor SEL. An example embodiment in which the pixel group PG has a tetracell structure in which four pixels PX1 to PX4 respectively include photoelectric conversion elements PD1 to PD4 is illustrated in FIG. 3, but the example embodiments are not limited thereto. For example, the pixel group PG may be implemented to have various different structures.

The first pixel PX1 may include the first photoelectric conversion element PD1 and the first transfer transistor Tx1, and each of the remaining pixels PX2, PX3, and PX4 may also include similar components/elements. The pixels PX1 to PX4 may share the reset transistor RST, the dual conversion transistor DC, the drive transistor Dx, and the select transistor SEL. Also, the pixels PX1 to PX4 may share a first floating diffusion region FD1.

The first floating diffusion region FD1 or a second floating diffusion region FD2 may accumulate (or integrate) charges corresponding to the amount of incident light. While the transfer transistors Tx1 to Tx4 are respectively turned on by transfer signals VT1 to VT4, the first floating diffusion region PD1 or the second floating diffusion region FD2 may accumulate (or integrate) charges supplied from the photoelectric conversion elements PD1 to PD4. Because the first floating diffusion region FD1 is connected with a gate terminal of the drive transistor Dx operating as a source follower amplifier, a voltage corresponding to the charges accumulated at the first floating diffusion region FD1 may be formed. For example, a capacitance of the first floating diffusion region FD1 is depicted as a first capacitance CFD1.

The dual conversion transistor DC may be driven by a dual conversion signal VDC. When the dual conversion transistor DC is turned off, the capacitance of the first floating diffusion region FD1 may correspond to the first capacitance CFD1. In a general environment, because the first floating diffusion region FD1 is not easily saturated, there is no need to increase the capacitance (e.g., CFD1) of the first floating diffusion region FD1. In some example embodiments, the dual conversion transistor DC may be turned off.

However, in a high-luminance environment, the first floating diffusion region FD1 may be easily saturated. To inhibit or prevent the saturation, the dual conversion transistor DC may be turned on such that the first floating diffusion region FD1 and the second floating diffusion region FD2 are electrically connected. In some example embodiments, a capacitance of the floating diffusion regions FD1 and FD2 may be increased to a sum of the first capacitance CFD1 and a second capacitance CFD2.

The transfer transistors Tx1 to Tx4 may be respectively driven by the transfer signals VT1 to VT4, and may transfer charges generated (or integrated) by the photoelectric conversion elements PD1 to PD4 to the first floating diffusion region FD1 or the second floating diffusion region FD2. For example, first ends of the transfer transistors Tx1 to Tx4 may be respectively connected with the photoelectric conversion elements PD1 to PD4, and second ends thereof may be connected in common with the first floating diffusion region FD1.

The reset transistor RST may be driven by the reset signal VRST and may provide the power supply voltage VDD to the first floating diffusion region FD1 or the second floating diffusion region FD2. As such, the charges accumulated in the first floating diffusion region FD1 or the second floating diffusion region FD2 may move to a terminal for the power supply voltage VDD, and a voltage of the first floating diffusion region FD1 or the second floating diffusion region FD2 may be reset.

The drive transistor Dx may amplify a voltage of the first floating diffusion region FD1 or the second floating diffusion region FD2 and may generate a pixel signal PIX corresponding to a result of the amplification. The select transistor SEL may be driven by the selection signal VSEL and may select pixels to be read in units of row. When the select transistor SEL is turned on, the pixel signal PIX may be output to the ADC circuit 140 of FIG. 2 through a column line CL.

Figure 4:
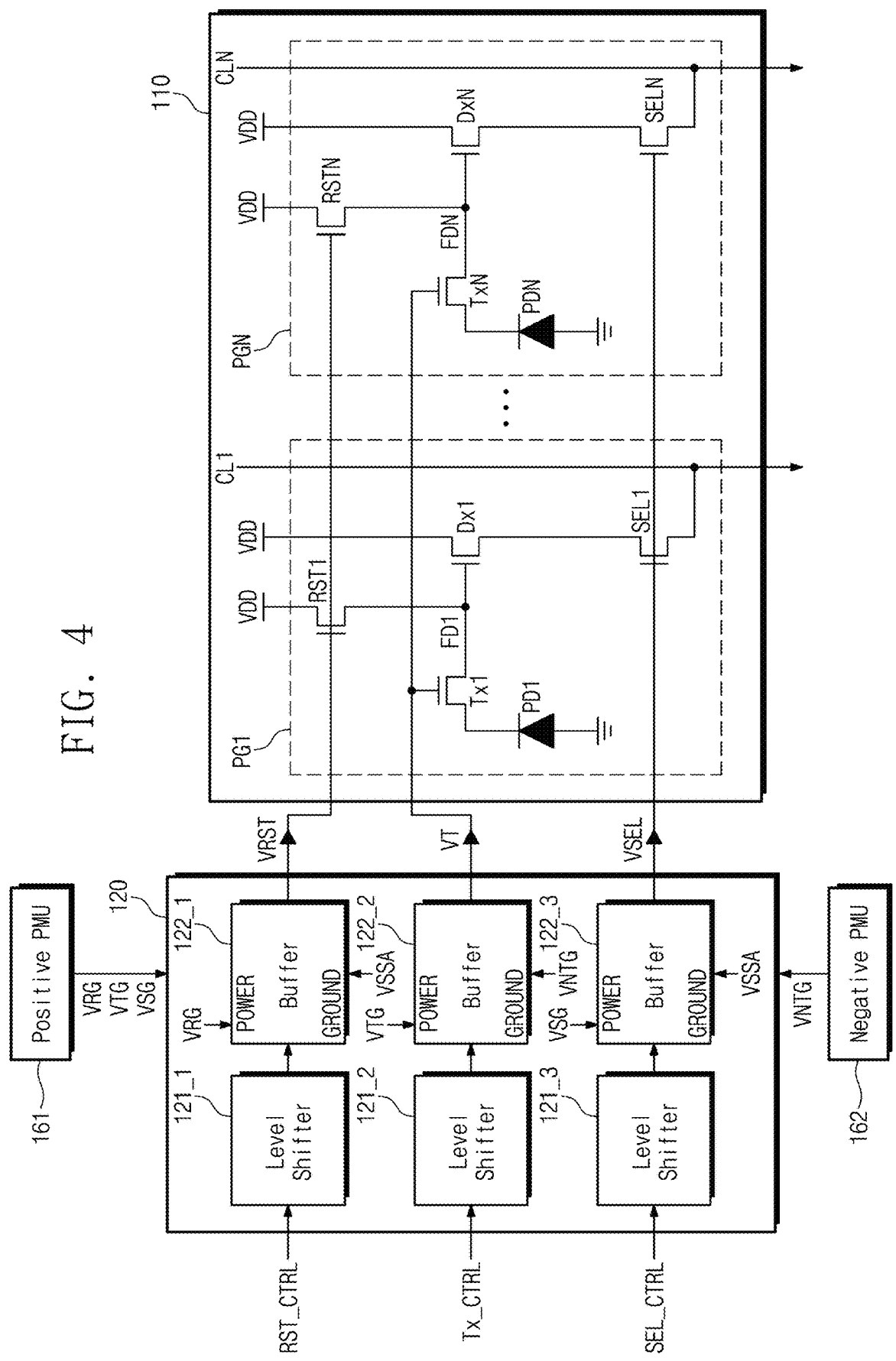
FIG. 4 is a diagram illustrating configurations of a pixel array, a row driver, and a power management module of FIG. 2 together.

FIG. 4 is a diagram illustrating configurations of the pixel array 110, the row driver 120, and the power management module 160 of FIG. 2 together. For brevity of illustration, an example of the pixel array 110 including "N" pixel groups PG1 to PGN arranged in one row is illustrated in FIG. 4. Also, it is assumed that each of the pixel groups PG1 to PGN includes one photoelectric conversion element and one transfer transistor. However, example embodiments are not limited thereto. For example, the pixel groups PG1 to PGN may be implemented like the pixel groups illustrated in FIG. 3.

Configurations and operations (e.g., charge integration of floating diffusion regions FD1 to FDN, and operations of reset transistors RST1 to RSTN, drive transistors Dx1 to DxN, and select transistors SEL1 to SELN) of the pixel groups PG1 to PGN are the same or substantially the same as those described with reference to FIG. 3, and thus, additional description will be omitted to avoid redundancy.

The row driver 120 may include a plurality of level shifters 121_1, 121_2, and 121_3 and a plurality of buffers 122_1, 122_2, and 122_3. The plurality of level shifters 121_1, 121_2, and 121_3 may respectively adjust voltage levels of control signals RST_CTRL, Tx_CTRL, and SEL_CTRL provided from the timing controller 150 (e.g., refer to FIG. 2) so as to be provided to the plurality of buffers 122_1, 122_2, and 122_3. For example, each of the plurality of level shifters 121_1, 121_2, and 121_3 may adjust a maximum voltage level of the provided signal from a digital power supply voltage level VDDD to an analog power supply voltage level VDDA. The plurality of buffers 122_1, 122_2, and 122_3 may temporarily store signals provided from the corresponding level shifters 121_1, 121_2, and 121_3. Also, the plurality of buffers 122_1, 122_2, and 122_3 may output the signals VRST, VT, and VSEL for controlling the pixel array 110 based on the signals stored therein and voltages provided from the positive PMU 161 and the negative PMU 162.

In detail, the positive PMU 161 may provide a reset power supply voltage VRG for generating the reset signal VRST to a power terminal POWER of the first buffer 122_1 as a power supply voltage, may provide a transfer power supply voltage VTG for generating the transfer signal VT of the high level to a power terminal POWER of the second buffer 122_2 as a power supply voltage, and may provide a selection power supply voltage VSG for generating the selection signal VSEL to a power terminal POWER of the third buffer 122_3 as a power supply voltage. The negative PMU 162 may provide a negative transfer power supply voltage VNTG for generating the transfer signal VT of the low level to a ground terminal GROUND of the second buffer 122_2 as a ground power supply voltage. An analog ground voltage VSSA may be provided to the ground terminals GROUND of the first buffer 122_1 and the third buffer 122_3.

As described with reference to FIG. 2, the noises included in the power supply voltages VRG, VTG, VSG, and VNTG may be reduced through the operations of the chopping circuits included in the positive PMU 161 and the negative PMU 162. Below, configurations and operations of the positive PMU 161 and the negative PMU 162 will be described in detail with reference to FIGS. 5A and 5B.

Figure 5A:
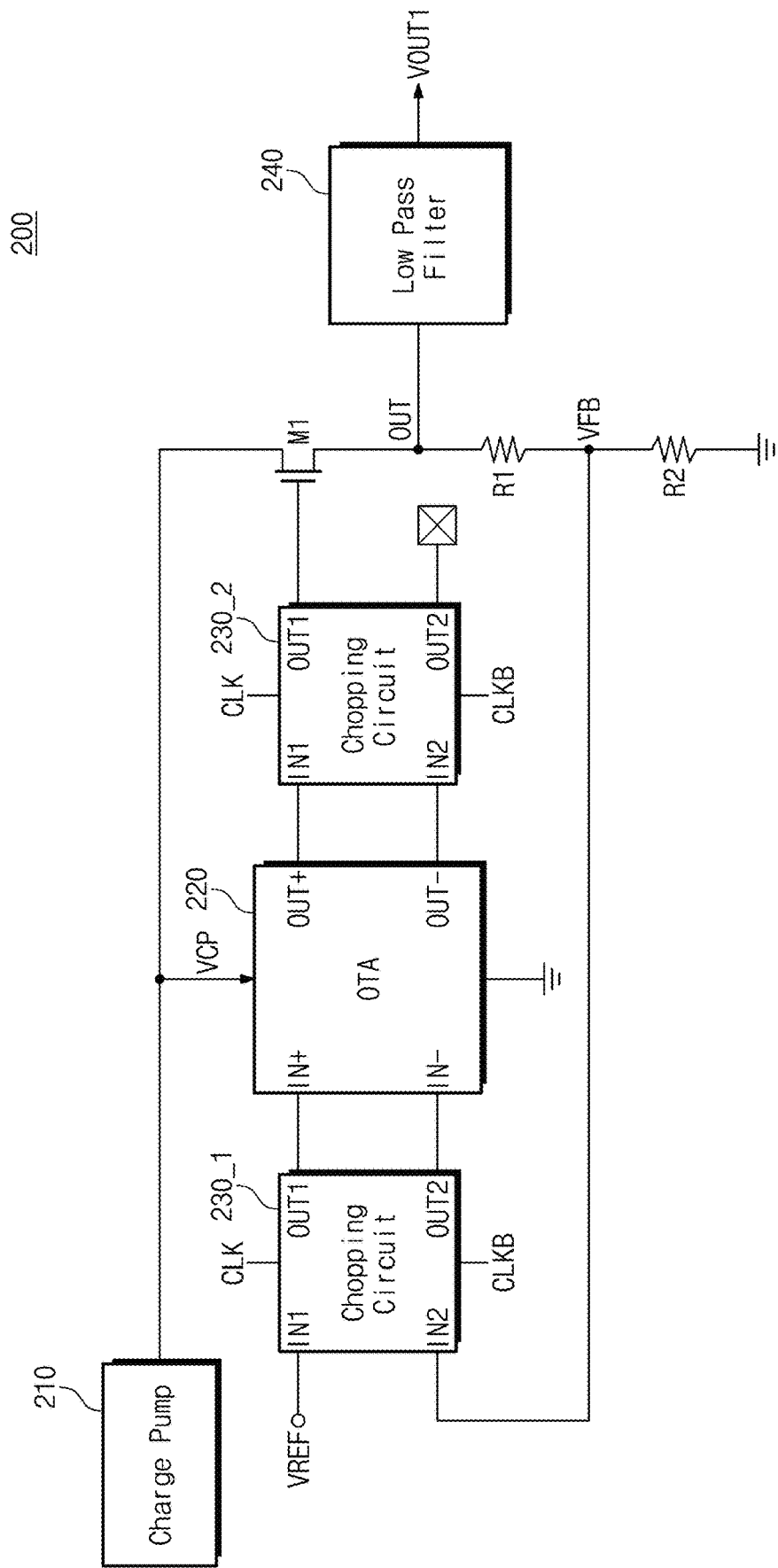
FIG. 5A is a diagram illustrating an example embodiment of a configuration of a positive power management device of FIG. 4.
Figure 5B:
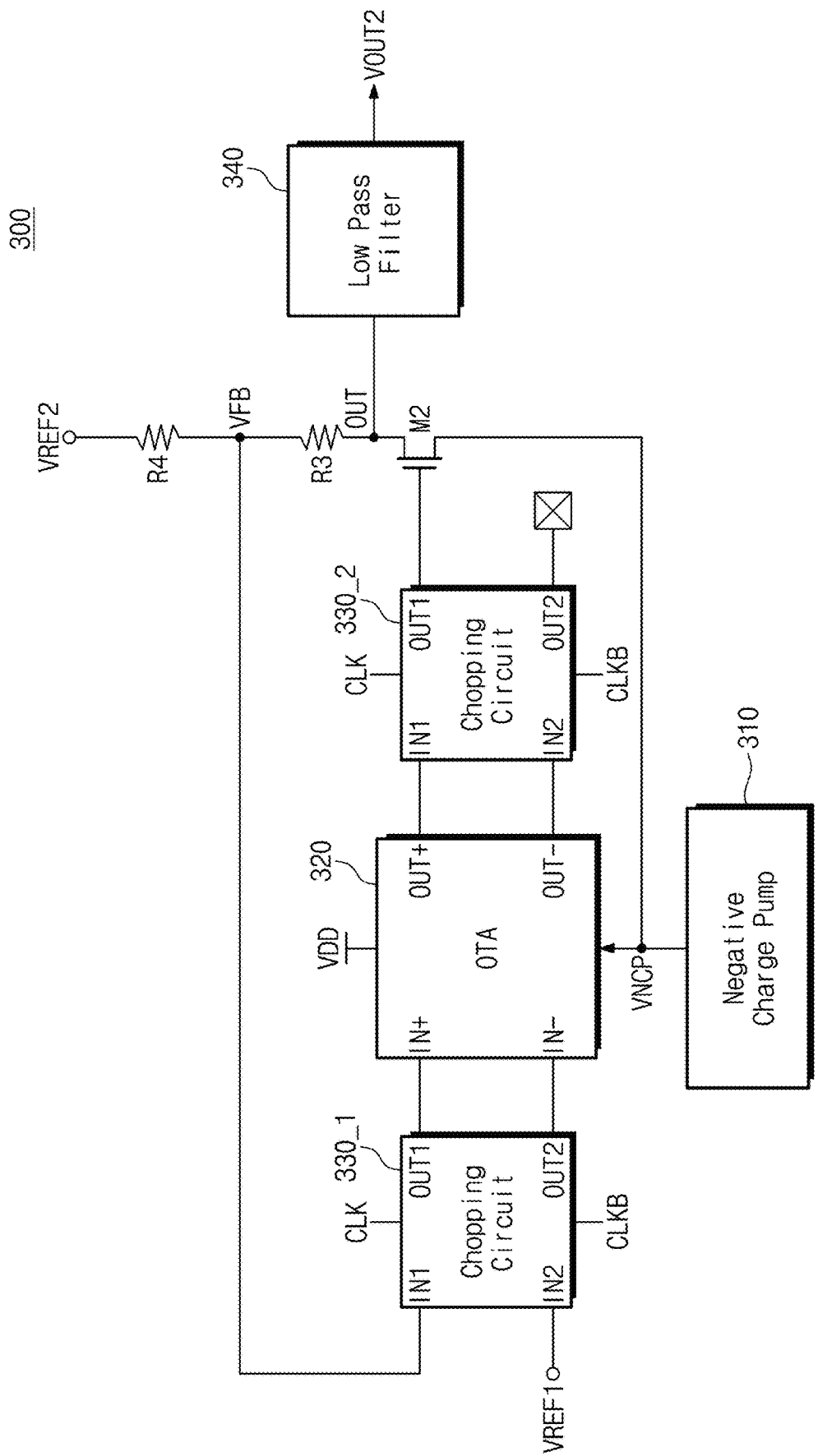
FIG. 5B is a diagram illustrating an example embodiment of a configuration of the negative power management device of FIG. 4.

FIG. 5A is a diagram illustrating an example embodiment of a configuration of the positive PMU 161 of FIG. 4, and FIG. 5B is a diagram illustrating an example embodiment of a configuration of the negative PMU 162 of FIG. 4.

Referring to FIG. 5A, a positive power management device 200 may include a charge pump 210, an amplifier 220, chopping circuits 230_1 and 230_2, a low pass filter 240, resistors R1 and R2, and a drive transistor M1. The charge pump 210 may operate as a DC-DC converter and may generate a charge pump signal VCP. For example, the charge pump 210 may include a capacitor for generating the charge pump signal VCP based on the power supply voltage. The charge pump 210 may provide the charge pump signal VCP as the power supply voltage to the amplifier 220 and may apply the charge pump signal VCP to the drive transistor M1.

The amplifier 220 may receive a reference voltage VREF passing through the first chopping circuit 230_1 and a feedback voltage VFB between the resistors R1 and R2 through input terminals IN+ and IN− and may amplify a difference between the reference voltage VREF and the feedback voltage VFB so as to be output through an output terminal (e.g., a positive output terminal OUT+). For example, the amplifier 220 may be implemented as an operational transconductance amplifier (OTA), but example embodiments are not limited thereto. The drive transistor M1 may receive an output of the amplifier 220 passing through the second chopping circuit 230_2 and the charge pump signal VCP and output a signal to an output node OUT. For example, the drive transistor M1 may be implemented as a PMOS transistor, but example embodiments are not limited thereto.

During the operation of the positive power management device 200, the noise may occur within the amplifier 220. For example, the noise that occurs within the amplifier 220 may refer to a flicker noise being a unique noise that occurs at an active element. The magnitude of the flicker noise may increase greatly in a low-frequency band (e.g., 100 Hz or less). In other words, the magnitude of the flicker noise may increase in inverse proportion to a frequency. When a signal including the noise is provided to the row driver 120 (e.g., refer to FIG. 2), a horizontal noise may be introduced into the entire row of the pixel array 110 (e.g., refer to FIG. 2) that is controlled by the row driver 120. Accordingly, there may be a need to reduce the noise occurring within the amplifier 220 for the purpose of preventing the quality of image from decreasing due to the horizontal noise.

The chopping circuits 230_1 and 230_2 that are connected with the input terminal and the output terminal of the amplifier 220 may perform the chopping operation for the purpose of reducing the above noise. First, the first chopping circuit 230_1 may receive and modulate the reference voltage VREF and the feedback voltage VFB between the resistors R1 and R2 as input signals of the amplifier 220. For example, the first chopping circuit 230_1 may modulate the reference voltage VREF and the feedback voltage VFB to signals whose center frequencies are higher than a frequency band of the noise occurring within the amplifier 220.

As such, the amplifier 220 may amplify the modulated signal. Because the modulated signal is a signal whose center frequency is out of the noise band, the signal amplified by the amplifier 220 may also not be affected by the noise. The second chopping circuit 230_2 may demodulate the output signal of the amplifier 220. For example, the second chopping circuit 230_2 may demodulate the output signal of the amplifier 220 to a signal having an original center frequency. In some example embodiments, the noise caused within the amplifier 220 may be modulated to a signal having a high center frequency upon passing through the second chopping circuit 230_2.

According to the above description, the signal passing through the second chopping circuit 230_2 may include the output signal of the amplifier 220 that has the original center frequency, and the noise that is caused within the amplifier 220 and is modulated to have the high center frequency. The signal passing through the second chopping circuit 230_2 may be output to the output node OUT through the drive transistor M1 and may then pass through the low pass filter 240. As such, the noise modulated to have the high center frequency may be reduced, and only the output signal of the amplifier 220 may be provided to the row driver 120 (e.g., refer to FIG. 2) as a first output voltage VOUT1. For example, the first output voltage VOUT1 may be used as one of the reset power supply voltage VRG, the transfer power supply voltage VTG, or the selection power supply voltage VSG.

The above operations of the chopping circuits 230_1 and 230_2 may be controlled based on a clock signal CLK and an inverse clock signal CLKB. For example, the clock signal CLK and the inverse clock signal CLKB may be generated by an external timing controller (e.g., 150 in FIG. 2) or may be generated by an internal clock generator (not illustrated). Depending on levels of the clock signal CLK and the inverse clock signal CLKB, the chopping circuit 230_1 or 230_2 may perform signal modulation or signal demodulation or may bypass an input signal thereof without modulation or demodulation.

For example, in the case where it is determined that there is a need to reduce the noise caused by the amplifier 220 when the positive power management device 200 generates the first output voltage VOUT1, under control of the timing controller or the clock generator, the chopping operations of the chopping circuits 230_1 and 230_2 may be enabled (e.g., the chopping circuits 230_1 and 230_2 may perform modulation and demodulation). In contrast, where it is determined that there is no need to reduce the noise caused by the amplifier 220, under control of the timing controller or the clock generator, the chopping operations of the chopping circuits 230_1 and 230_2 may be disabled (e.g., the chopping circuits 230_1 and 230_2 may bypass input signals).

Referring to FIG. 5B, a negative power management device 300 may include a negative charge pump 310, an amplifier 320, chopping circuits 330_1 and 330_2, a low pass filter 340, resistors R3 and R4, and a drive transistor M2. Like the charge pump 210, the negative charge pump 310 may operate as the DC-DC converter and may generate a negative charge pump signal VNCP. The negative charge pump 310 may provide the negative charge pump signal VNCP as the ground voltage to the amplifier 320 and may apply the negative charge pump signal VNCP to the drive transistor M2.

As in the amplifier 220, the amplifier 320 may amplify and output a difference between a first reference voltage VREF1 passing through the first chopping circuit 330_1 and a feedback voltage VFB between the resistors R3 and R4. The drive transistor M2 may receive an output of the amplifier 320 passing through the second chopping circuit 330_2 and the negative charge pump signal VNCP and may output a signal to an output node OUT. For example, the drive transistor M2 may be implemented as an NMOS transistor, but example embodiments are not limited thereto. A configuration and an operation of the negative power management device 300 are identical or substantially identical to the configuration and the operation of the positive power management device 200 except that the feedback voltage VFB between the resistors R3 and R4 is based on a second reference voltage VREF2.

As described with reference to FIG. 5A, the signal passing through the second chopping circuit 330_2 may be output to the output node OUT through the driving transistor M2 and may then pass through the low pass filter 340. As such, the noise caused within the amplifier 320 (e.g., the noise modulated to have the high center frequency) may be reduced, and only the output signal of the amplifier 320 may be provided to the row driver 120 (e.g., refer to FIG. 2) as a second output voltage VOUT2. For example, the second output voltage VOUT2 may be used as the negative transfer power supply voltage VNTG.

As in the above description given with reference to FIG. 5A, the operations of the chopping circuits 330_1 and 330_2 may be controlled by the clock signal CLK and the inverse clock signal CLKB generated by the timing controller 150 (e.g., refer to FIG. 2) or the internal clock generator (not illustrated). In FIGS. 5A and 5B, the chopping circuits 230_1, 230_2, 330_1, and 330_2 are illustrated as being implemented outside the amplifiers 220 and 320, but example embodiments are not limited thereto. For example, the chopping circuits 230_1, 230_2, 330_1, and 330_2 may be implemented as in the amplifiers 220 and 320. In addition, in FIGS. 5A and 5B, each of the positive power management device 200 and the negative power management device 300 is illustrated as including two chopping circuits, but example embodiments are not limited thereto. For example, each of the positive power management device 200 and the negative power management device 300 may include more chopping circuits. In FIGS. 5A and 5B, the low pass filters 240 and 340 may be implemented as separate circuits, but example embodiments are not limited thereto. For example, each of the low pass filters 240 and 340 may be implemented by connecting a capacitor with the output node OUT.

Figure 6:
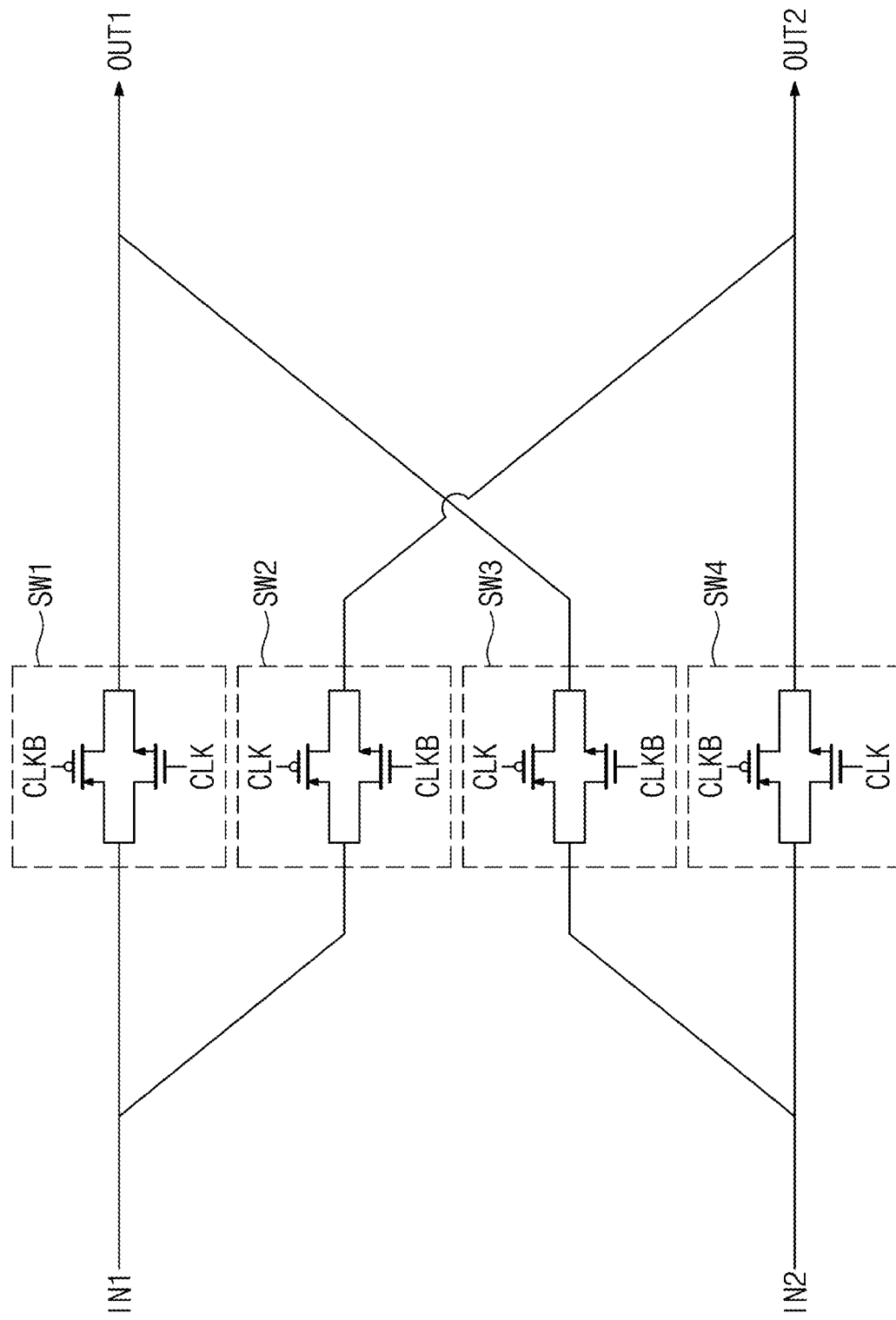
FIG. 6 is a diagram illustrating an example embodiment of a configuration of chopping circuits of FIGS. 5A and 5B.

FIG. 6 is a diagram illustrating an example embodiment of a configuration of the chopping circuits 230_1, 230_2, 330_1, and 330_2 of FIGS. 5A and 5B. Referring to FIG. 6, a chopping circuit may include first to fourth switches SW1 to SW4 that operate depending on the clock signal CLK and the inverse clock signal CLKB. For example, each of the first to fourth switches SW1 to SW4 may include transistors that operate in response to the clock signal CLK and the inverse clock signal CLKB. However, example embodiments are not limited thereto. For example, the first to fourth switches SW1 to SW4 may be implemented by using components (e.g., capacitors) different from those illustrated in FIG. 6.

In detail, each of the first switch SW1 and the fourth switch SW4 may include a PMOS transistor that operates in response to the clock signal CLK and an NMOS transistor that operates in response to the inverse clock signal CLKB. Each of the second switch SW2 and the third switch SW3 may include a PMOS transistor that operates in response to the clock signal CLK and an NMOS transistor that operates in response to the inverse clock signal CLKB.

When the clock signal CLK is at the high level and the inverse clock signal CLKB is at the low level, the first switch SW1 and the fourth switch SW4 may be turned on, and the second switch SW2 and the third switch SW3 may be turned off. In some example embodiments, a first input terminal IN1 may be connected with a first output terminal OUT1, and a second input terminal IN2 may be connected with a second output terminal OUT2. The above state of the chopping circuit in which the first input terminal IN1 is connected with the first output terminal OUT1 and the second input terminal IN2 is connected with the second output terminal OUT2 is referred to as a "first state".

In contrast, when the clock signal CLK is at the low level and the inverse clock signal CLKB is at the high level, the first switch SW1 and the fourth switch SW4 may be turned off, and the second switch SW2 and the third switch SW3 may be turned on. In some example embodiments, the first input terminal IN1 may be connected with the second output terminal OUT2, and the second input terminal IN2 may be connected with the first output terminal OUT1. The above state of the chopping circuit 400 in which the first input terminal IN1 is connected with the second output terminal OUT2 and the second input terminal IN2 is connected with the first output terminal OUT1 is referred to as a "second state".

When the chopping operation of the chopping circuit is enabled, the clock signal CLK and the inverse clock signal CLKB may be controlled such that the first state and the second state are maintained in turn periodically; in some example embodiments, the chopping circuit may perform modulation or demodulation on an input signal. In other words, when the chopping operation is enabled, each of the clock signal CLK and the inverse clock signal CLKB may have a high-to-low transition and a low-to-high transition periodically.

In contrast, when the chopping operation of the chopping circuit is disabled, the clock signal CLK and the inverse clock signal CLKB may be controlled such that only the first state is maintained; in this case, the chopping circuit 400 may bypass the input signal. In other words, when the chopping operation is disabled, the clock signal CLK may continue to be maintained at the high level, and the inverse clock signal CLKB may continue to be maintained at the low level.

As described with reference to FIGS. 5A and 5B, the clock signal CLK and the inverse clock signal CLKB may be generated by the timing controller (e.g., 150 in FIG. 2) implemented outside the power management device or the clock generator implemented as in the power management device.

Figure 7A:
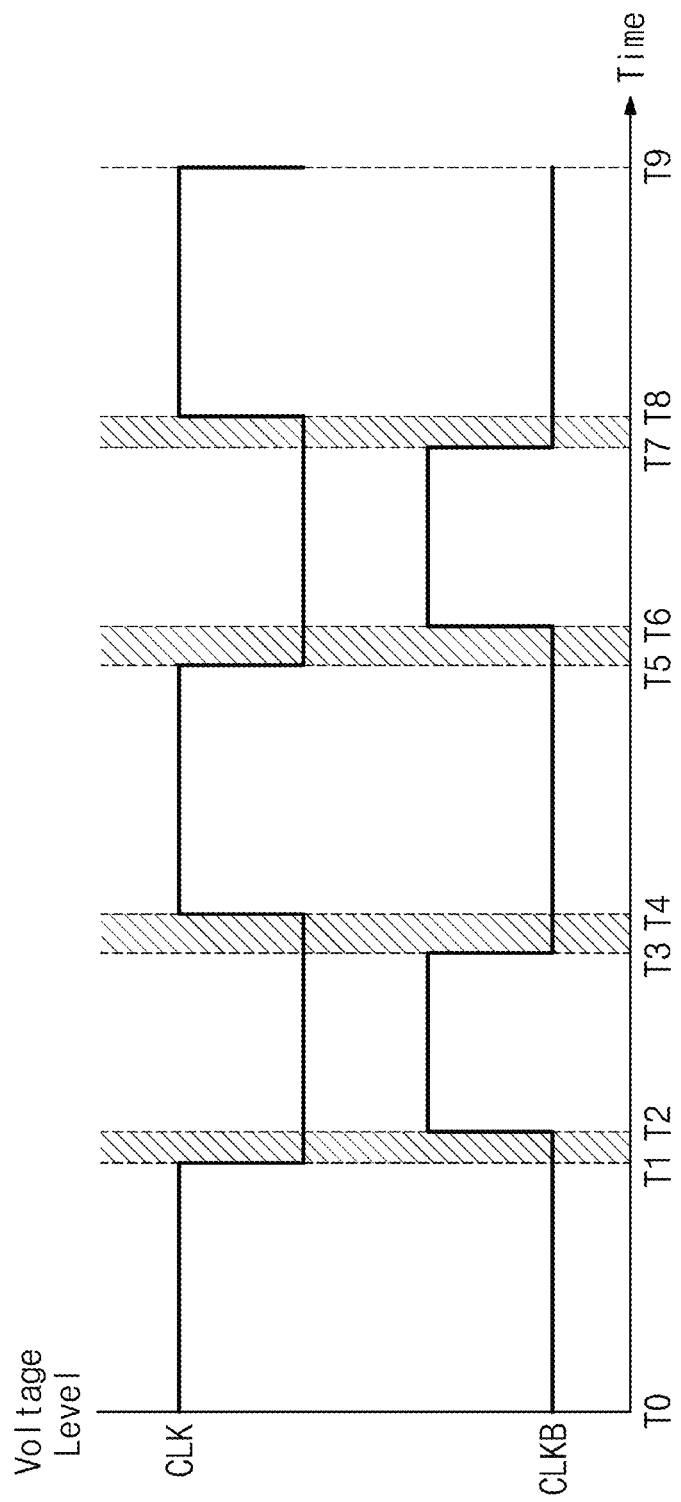
FIG. 7A is a timing diagram of a clock signal and an inverse clock signal when a chopping operation of a chopping circuit of FIG. 6 is enabled.

FIG. 7A is a timing diagram of the clock signal CLK and the inverse clock signal CLKB when the chopping operation of the chopping circuit of FIG. 6 is enabled, and FIG. 7B is a timing diagram of the clock signal CLK and the inverse clock signal CLKB when the chopping operation of the chopping circuit of FIG. 6 is disabled. Below, the description will be given with reference to FIGS. 6, 7A, and 7B.

Referring to FIG. 7A, when the chopping operation of the chopping circuit is enabled, each of the clock signal CLK and the inverse clock signal CLKB may have the high-to-low transition and the low-to-high transition periodically. During time periods from T0 to T1, from T4 to T5, and from T8 to T9, the clock signal CLK may be at the high level, and the inverse clock signal CLKB may be at the low level; in some example embodiments, the state of the chopping circuit 400 may be set to the first state. In contrast, during time periods from T2 to T3, and from T6 to T7, the clock signal CLK may be at the low level, and the inverse clock signal CLKB may be at the high level; in some example embodiments, the state of the chopping circuit 400 may be set to the second state. During time periods from T1 to T2, from T3 to T4, from T5 to T6, and from T7 to T8, both the clock signal CLK and the inverse clock signal CLKB may be at the low level. During the above time periods (marked by oblique lines), all the switches of the chopping circuit may be temporarily turned off; in this case, input signals may not be transferred.

That is, when the chopping operation of the chopping circuit is enabled, the chopping circuit 400 may periodically have the first state and the second state and may have a time period, in which input signals are not temporarily transferred, between the first state and the second state. The chopping circuit may perform signal modulation or demodulation by periodically changing the connection state between the input terminals and the output terminals.

Meanwhile, referring to FIG. 7B, when the chopping operation of the chopping circuit 400 is disabled, the clock signal CLK may be maintained at the high level, and the inverse clock signal CLKB may be maintained at the low level. That is, the chopping circuit 400 may be maintained in the first state. In the first state in which the connection state between the input terminals and the output terminals is maintained without change, the chopping circuit 400 may not perform modulation or demodulation on input signals, that is, the chopping circuit 400 may bypass the input signals so as to be output through the output terminals without modification.

Also, according to an example embodiment, the enable or disable of the chopping operation may be determined depending on ambient illumination of an object. For example, in a high-illumination environment, because the dynamic range is wide, the noise that is caused within the amplifier of the power management device may not degrade an image. Accordingly, in the high-illumination environment, the chopping operation of the power management device may be disabled; in some example embodiments, the clock signal CLK and the inverse clock signal CLKB may be controlled as illustrated in FIG. 7B.

In contrast, in a low-illuminance environment, because the dynamic range is narrow, the noise that is caused within the amplifier of the power management device may degrade an image. Accordingly, in the low-illuminance environment, the chopping operation of the power management device may be enabled; in this case, the clock signal CLK and the inverse clock signal CLKB may be controlled as illustrated in FIG. 7A.

Figure 8A:
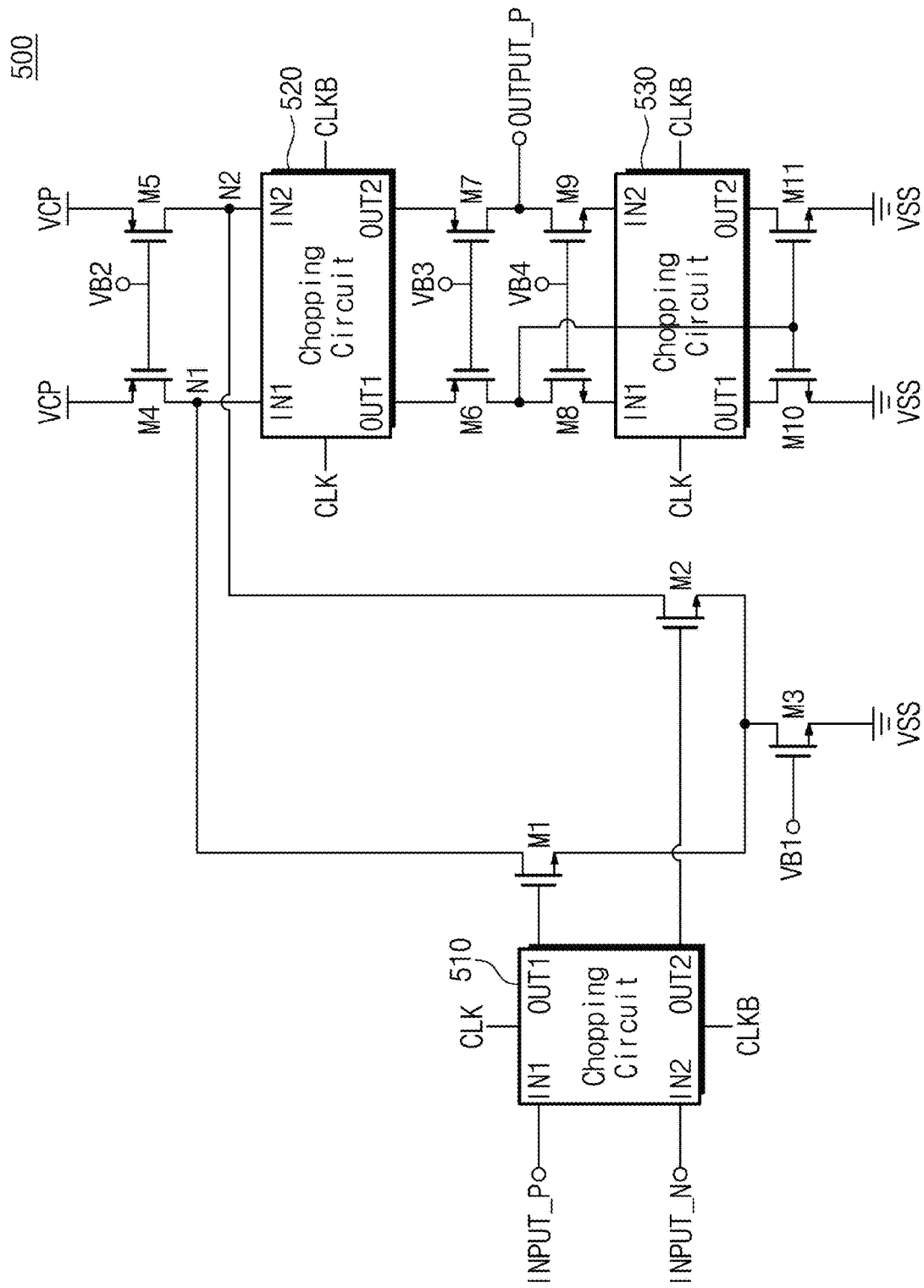
FIG. 8A is a diagram illustrating example of a configuration of amplifiers of FIGS. 5A and 5B with which chopping circuits are connected.

FIG. 8A is a diagram illustrating an example of a configuration of the amplifiers 220 and 320 of FIGS. 5A and 5B with which chopping circuits are connected. Referring to FIG. 8A, an amplifier 500 may include a plurality of transistors M1 to M11 and chopping circuits 510, 520, and 530. For example, the transistors M1, M2, and M3 of an input stage and the transistors M8, M9, M10, and M11 may be implemented as an NMOS transistor, and the transistors M4, M5, M6, and M7 may be implemented as a PMOS transistor.

Referring to FIG. 8A, input signals INPUT_P and INPUT_N passing through the chopping circuit 510 may be respectively input to gate terminals of the transistors M1 and M2. Source terminals of the transistors M1 and M2 may be connected with a drain terminal of the transistor M3. The transistor M3 may generate a power source current based on a first bias signal VB1. For example, the transistors M4 and M5, the transistors M6 and M7, the transistors M8 and M9, and the transistors M10 and M11 may be connected in the form of a current mirror.

The transistors M4 and M5 may operate in response to a second bias signal VB2 and may be supplied with the power supply voltage (e.g., the positive charge pump signal VCP of FIG. 5A). Drain terminals of the transistors M4 and M5 may be respectively connected with drain terminals of the transistors M1 and M2 at nodes N1 and N2. Also, the drain terminals of the transistors M4 and M5 may be connected with the chopping circuit 520. The chopping circuit 520 may receive voltage levels of the nodes N1 and N2 and may output the voltage levels to source terminals of the transistors M6 and M7 operating in response to a third bias signal VB3. The transistor M7 may output an output signal OUTPUT_P based on the output of the chopping circuit 520 and the third bias signal VB3.

Meanwhile, the transistor M6 may output a signal based on the output of the chopping circuit 520 and the third bias signal VB3, so as to be applied to gate terminals of the transistors M10 and M11. Source terminals of the transistors M8 and M9 operating in response to a fourth bias signal VB4 and drain terminals of the transistors M10 and M11 may be connected with the chopping circuit 530. Source terminals of the transistors M10 and M11 may be connected with a ground voltage terminal VSS.

Figure 8B:
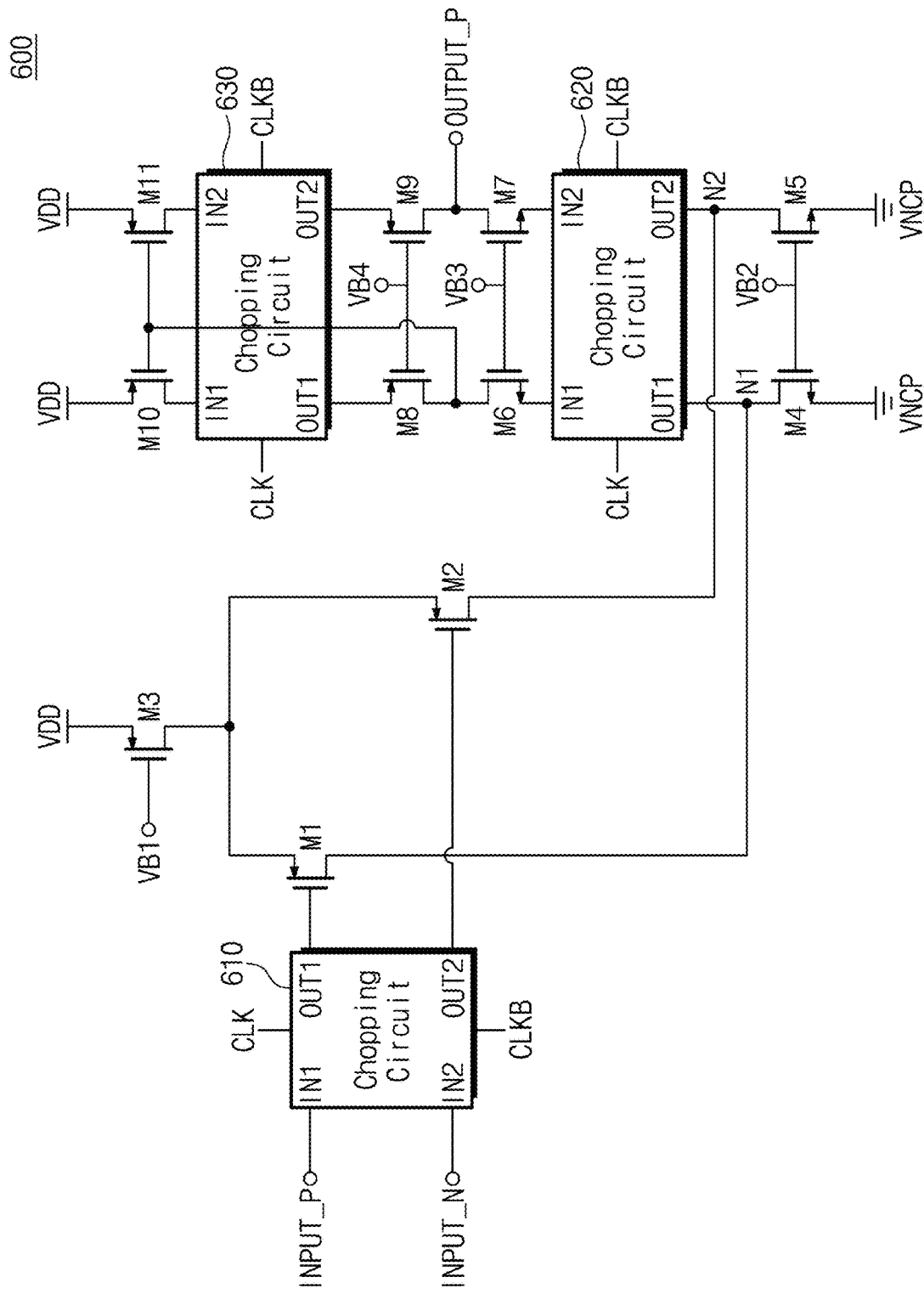
FIG. 8B is a diagram illustrating another example embodiment of a configuration of amplifiers of FIGS. 5A and 5B with which chopping circuits are connected.

FIG. 8B is a diagram illustrating another example of a configuration of the amplifiers 220 and 320 of FIGS. 5A and 5B with which chopping circuits are connected. Referring to FIG. 8B, an amplifier 600 may include a plurality of transistors M1 to M11 and chopping circuits 610, 620, and 630. For example, the transistors M1, M2, and M3 of an input stage and the transistors M8, M9, M10, and M11 may be implemented as a PMOS transistor, and the transistors M4, M5, M6, and M7 may be implemented as an NMOS transistor. For example, a ground voltage that is applied to the amplifier 600 may be the negative charge pump signal VNCP of FIG. 5B. A configuration and an operation of the amplifier 600 are identical or substantially identical to the configuration and the operation of the amplifier 500 of FIG. 8A except that the transistors M1, M2, and M3 of the input stage are implemented as a PMOS transistor, and thus, additional description will be omitted to avoid redundancy.

The chopping circuits 510, 520, 530, 610, 620, and 630 of FIGS. 8A and 8B are illustrated as being implemented as in the amplifiers 500 and 600, but example embodiments are not limited thereto. For example, the chopping circuits 510, 520, 530, 610, 620, and 630 may exist outside the amplifiers 500 and 600 like the chopping circuits 230_1, 230_2, 330_1, and 330_2 illustrated in FIGS. 5A and 5B. When the chopping operations of the chopping circuits 510, 520, and 530 or 610, 620, and 630 are enabled, the noise that is caused within the amplifier 500 or 600 may be reduced, and the output signal OUTPUT_P may refer to a signal that is obtained by amplifying the difference between the input signals INPUT_P and INPUT_N.

Figure 9:
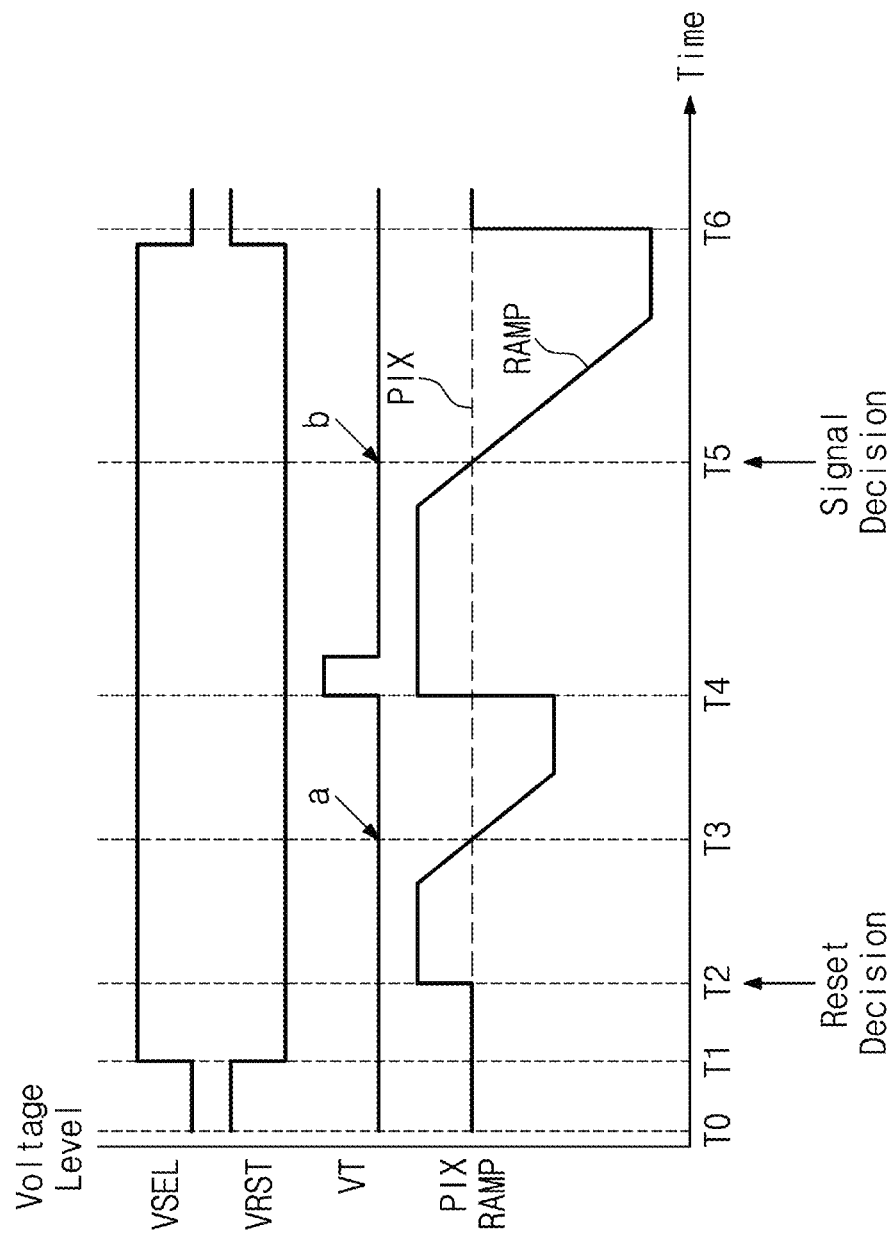
FIG. 9 is a timing diagram illustrating an operation of a pixel array of FIG. 4.

FIG. 9 is a timing diagram illustrating an operation of the pixel array 110 of FIG. 4. At a point in time T0, the reset transistors RST1 to RSTN of the pixel groups PG1 to PGN may be turned on in response to the reset signal VRST of the high level, and voltages of the floating diffusion regions FD1 to FDN may be reset. At a point in time T1, the reset transistors RST1 to RSTN may be turned off, and the selection transistors SEL1 to SELN may be turned on in response to the selection signal VSEL of the high level.

To perform digital conversion on the reset signals of the pixel groups PG1 to PGN, at a point in time T2, an offset may be applied to the ramp signal RAMP. Afterwards, the ramp signal RAMP may decrease; then, at a point in time T3, an operation of comparing the reset signal of the pixel signal PIX and the ramp signal RAMP (e.g., the reset decision) may be completed. To perform digital conversion on the image signals of the pixel groups PG1 to PGN, at a point in time T4, the transfer transistors Tx1 to TxN may be turned on in response to the transfer signal VT of the high level, and then, the offset may be again applied to the ramp signal RAMP. The transfer transistors Tx1 to TxN may transfer charges to the floating diffusion regions FD1 to FUN and may then be again turned off. The ramp signal RAMP may decrease, and then, at a point in time T5, an operation of comparing the image signal of the pixel signal PIX and the ramp signal RAMP (e.g., the signal decision) may be completed.

Herein, as marked by arrows "a" and "b", the transfer signal VT is at the low level at the point in times T3 and T5 when the reset decision and the signal decision are performed. In other words, at the point in times T3 and T5, the pixel array 110 may be provided with the transfer signal VT of the low level from the row driver 120, and the transfer signal VT of the low level is based on the negative transfer power supply voltage VNTG generated by the negative PMU 162.

Accordingly, most of the horizontal noise that is able to be introduced into the pixel array 110 at the point in times T3 and T5 may be based on the noise caused within the amplifier of the negative PMU 162, and the noise that is caused within the amplifier of the positive PMU 161 may not be significant. Accordingly, while the correlated double sampling (CDS) is performed, the chopping operation of the negative PMU 162 may be enabled, and the chopping operation of the positive PMU 161 may be disabled. For example, while the correlated double sampling (CDS) is performed, the chopping circuits included in the negative PMU 162 may be controlled depending on the clock signal CLK and the inverse clock signal CLKB illustrated in FIG. 7A, and the chopping circuits included in the positive PMU 161 may be controlled depending on the clock signal CLK and the inverse clock signal CLKB illustrated in FIG. 7B.

Figure 10:
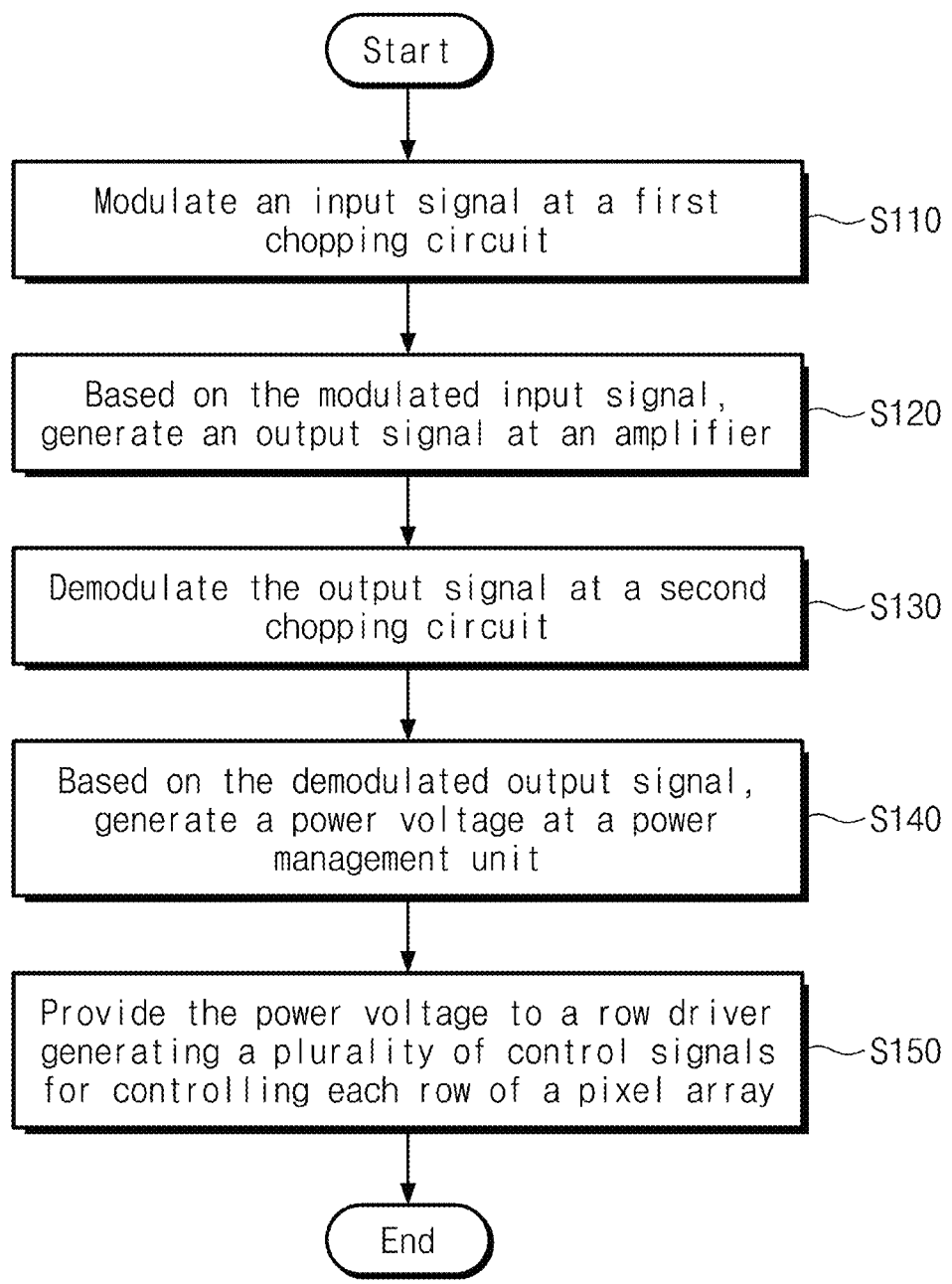
FIG. 10 is a flowchart illustrating an example of an operation method of a power management device according to an example embodiment of the present disclosure.

FIG. 10 is a flowchart illustrating an example of an operation method of a power management device according to an example embodiment of the inventive concepts. Below, the description will be given with reference to FIGS. 5A and 10.

In operation S110, the first chopping circuit 230_1 may modulate the input signals VREF and VFB. In detail, the first chopping circuit 230_1 may modulate the input signals VREF and VFB so as to have a frequency band higher than a frequency band of a noise caused within the amplifier 220. In operation S120, the amplifier 220 may output a signal to an output terminal (e.g., OUT+) based on a difference between the modulated input signals VREF and VFB. In operation S130, the second chopping circuit 230_2 may demodulate the output of the amplifier 220. In detail, the second chopping circuit 230_2 may demodulate the output of the amplifier 220 so as to have the original frequency band and may modulate the noise caused within the amplifier 220 so as to have the high frequency band.

In operation S140, the positive power management device 200 may generate the first output voltage VOUT1 as a power supply voltage based on the demodulated output of the amplifier 220. In detail, the drive transistor M1 may be supplied with the charge pump signal VCP and the output of the amplifier 220 and may output the signal (e.g., including the demodulated output of the amplifier 220 and the modulated noise) to the output node OUT, and the low pass filter 240 may reduce the modulated noise. Afterwards, in operation S150, the first output voltage VOUT1 may be provided to the row driver 120 as a power supply voltage.

According to an example embodiment of inventive concepts, the degradation of an image may be prevented by reducing a horizontal noise that is introduced into a pixel array.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

One or more of the elements disclosed above may include or be implemented in one or more processing circuitries such as hardware including logic circuits; a hardware/software combination such as a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FGPA), a System-on-Chip (SoC), a programmable logic unit, a microprocessor, application-specific integrated circuit (ASIC), etc.

While the inventive concepts have been described with reference to some example embodiments thereof, it will be apparent to those of ordinary skill in the art that various changes and modifications may be made thereto without departing from the ad scope of the inventive concepts.

What is claimed is:

1. An image sensor comprising:
a pixel array including a plurality of pixel groups arranged in a plurality of rows and a plurality of columns, the plurality of pixel groups configured to convert a light into electrical signals and to generate pixel signals, and each of the plurality of pixel groups including a reset transistor, a select transistor, and a transfer transistor;
a row driver configured to generate a plurality of control signals for controlling the rows of the pixel array, and supply the plurality of control signals to the plurality of pixel groups, the plurality of control signals including a reset signal for controlling the reset transistor, a selection signal for controlling the select transistor, and a transfer signal for controlling the transfer transistor;
one or more power management devices configured to generate a power supply voltage for generating the plurality of control signals based on an input signal, and supply the power supply voltage to the row driver, each of the one or more power management devices including a first chopping circuit configured to modulate the input signal, an amplifier configured to generate an output signal based on the modulated input signal, and a second chopping circuit configured to demodulate the output signal and to modulate a noise caused by the amplifier, the power supply voltage including a reset power supply voltage for generating the reset signal, a selection power supply voltage for generating the selection signal, a first transfer power supply voltage for generating the transfer signal of a high level, and a second transfer power supply voltage for generating the transfer signal of a low level; and
a timing controller configured to generate a signal for controlling the row driver and the one or more power management devices, the timing controller configured to generate a clock signal and an inverse clock signal for controlling the first chopping circuit and the second chopping circuit.

2. The image sensor of claim 1, wherein each of the one or more power management devices further includes:
a charge pump configured to generate a charge pump signal for operating the amplifier; and
a drive transistor configured to receive the charge pump signal and the output signal, and to output a signal to an output node.

3. The image sensor of claim 2, wherein
a frequency band of the input signal is a first frequency band,
the first chopping circuit is configured to modulate the input signal to have a third frequency band higher than a second frequency band of the noise,
the second chopping circuit is configured to demodulate the output signal to have the first frequency band, and
the signal output to the output node includes the demodulated output signal and the modulated noise.

4. The image sensor of claim 3, wherein
each of the one or more power management devices further includes a low pass filter configured to reduce the modulated noise and to supply the demodulated output signal as the power supply voltage, and
the low pass filter includes a capacitor connected with the output node.

5. The image sensor of claim 1, wherein the row driver includes:
a first buffer configured to receive the reset power supply voltage as a power supply voltage and to generate the reset signal;
a second buffer configured to receive the first transfer power supply voltage as a power supply voltage, to receive the second transfer power supply voltage as a ground voltage, and to generate the transfer signal of the high level or the transfer signal of the low level; and
a third buffer configured to receive the selection power supply voltage as a power supply voltage and to generate the selection signal.

6. The image sensor of claim 1, wherein the one or more power management devices include:
a positive power management device configured to generate the reset power supply voltage, the selection power supply voltage, and the first transfer power supply voltage; and
a negative power management device configured to generate the second transfer power supply voltage.

7. The image sensor of claim 6, wherein each of the first chopping circuit and the second chopping circuit includes:
a first switch connected between a first input terminal and a first output terminal;
a second switch connected between the first input terminal and a second output terminal;
a third switch connected between a second input terminal and the first output terminal; and
a fourth switch connected between the second input terminal and the second output terminal.

8. The image sensor of claim 7, wherein,
when the clock signal is at the high level and the inverse clock signal is at the low level, the first switch and the fourth switch are turned on, and
when the clock signal is at the low level and the inverse clock signal is at the high level, the second switch and the third switch are turned on.

9. The image sensor of claim 8, wherein the timing controller is configured to:
control the clock signal and the inverse clock signal to maintain the clock signal applied to the first chopping circuit and the second chopping circuit of the positive power management device at the high level, and the inverse clock signal applied to the first chopping circuit and the second chopping circuit of the positive power management device at the low level, and
control the clock signal and the inverse clock signal to periodically switch levels of the clock signal and the inverse clock signal applied to the first chopping circuit and the second chopping circuit of the negative power management device.

10. An operation method of an image sensor which includes a power management device including an amplifier, a first chopping circuit, and a second chopping circuit, the method comprising:
modulating, at the first chopping circuit, an input signal;
generating, at the amplifier, an output signal based on the modulated input signal;
demodulating, at the second chopping circuit, the output signal;
generating, at the power management device, a power supply voltage based on the demodulated output signal; and
providing the power supply voltage to a row driver configured to generate a plurality of control signals for controlling rows of a pixel array, the plurality of control signals including a reset signal for controlling a reset transistor of the pixel array, a selection signal for controlling a select transistor of the pixel array, and a transfer signal for controlling a transfer transistor of the pixel array, and the power supply voltage including a reset power supply voltage for generating the reset signal, a selection power supply voltage for generating the selection signal, a first transfer power supply voltage for generating the transfer signal of a high level, and a second transfer power supply voltage for generating the transfer signal of a low level.

11. The method of claim 10, wherein
a frequency band of the input signal is a first frequency band,
the modulating of the input signal includes modulating, at the first chopping circuit, the input signal to have a third frequency band higher than a second frequency band of a noise caused by the amplifier,
the demodulating of the output signal includes demodulating, at the second chopping circuit, the output signal to have the first frequency band; and
modulating, at the second chopping circuit, the noise.

12. The method of claim 11, wherein the generating of the power supply voltage includes:
reducing, at a low pass filter of the power management device, the modulated noise; and
generating the demodulated output signal as the power supply voltage.

13. The method of claim 10, wherein
the image sensor further includes a timing controller, and
the method further comprises generating, at the timing controller, a clock signal and an inverse clock signal to control the first chopping circuit and the second chopping circuit.

* * * * *